United States Patent
Sunter

(10) Patent No.: US 6,590,412 B2
(45) Date of Patent: Jul. 8, 2003

(54) CIRCUIT AND METHOD FOR DETECTING TRANSIENT VOLTAGES ON A DC POWER SUPPLY RAIL

(75) Inventor: Stephen K. Sunter, Nepean (CA)

(73) Assignee: LogicVision, Inc., San Jose, CA (US)

( * ) Notice: Subject to any disclaimer, the term of this patent is extended or adjusted under 35 U.S.C. 154(b) by 92 days.

(21) Appl. No.: 09/888,605

(22) Filed: Jun. 26, 2001

(65) Prior Publication Data

US 2002/0196048 A1 Dec. 26, 2002

(51) Int. Cl.[7] ............................................. G01R 31/36
(52) U.S. Cl. ........................ 324/771; 324/537; 324/765
(58) Field of Search ................................ 324/771, 537, 324/765, 769, 72; 326/121, 33; 365/226, 203; 361/56

(56) References Cited

U.S. PATENT DOCUMENTS

| | | | |
|---|---|---|---|
| 5,138,266 A | 8/1992 | Stearns | 324/537 |
| 5,254,953 A | 10/1993 | Crook et al. | 324/538 |
| 5,391,993 A | 2/1995 | Khazam et al. | 324/684 |
| 5,420,500 A | 5/1995 | Kerschner | 324/73.5 |
| 5,483,170 A * | 1/1996 | Beasley et al. | 324/537 |
| 5,498,972 A * | 3/1996 | Haulin | 324/765 |
| 5,557,209 A | 9/1996 | Crook et al. | 324/537 |
| 5,726,997 A | 3/1998 | Teene | 714/726 |
| 6,118,295 A * | 9/2000 | Murayama et al. | 324/771 |

OTHER PUBLICATIONS

Tegethoff et al., "Opens Board Test Coverage: When Is 99% Really 40%", Paper 12.2, 1996 ITC Proceedings, p. 333 , Oct. 25–26, 1996.

De Jong et al., "Power Pin Testing: Making the Test Coverage Complete", 2000 ITC Proceedings, p. 575 , Oct. 3–5, 2000.

* cited by examiner

Primary Examiner—N. Le
Assistant Examiner—James C. Kerveros
(74) Attorney, Agent, or Firm—Eugene E. Proulx

(57) ABSTRACT

A method for detecting a missing or defective power supply pin connection or other defect that results in excessive transient voltages on power supply rails of a circuit comprises applying a dc voltage, whose level is substantially independent of transient voltages on the supply voltage rails, to a sensor logic gate whose output is applied to a latching circuit, applying a signal transition to a stimulus logic gate that is connected to the supply voltage rail, and monitoring the output of a latching circuit for a change in state, a change of state indicating a missing or defective power supply pin connection or other such defect.

37 Claims, 8 Drawing Sheets

Fig. 3 *(Prior Art)*
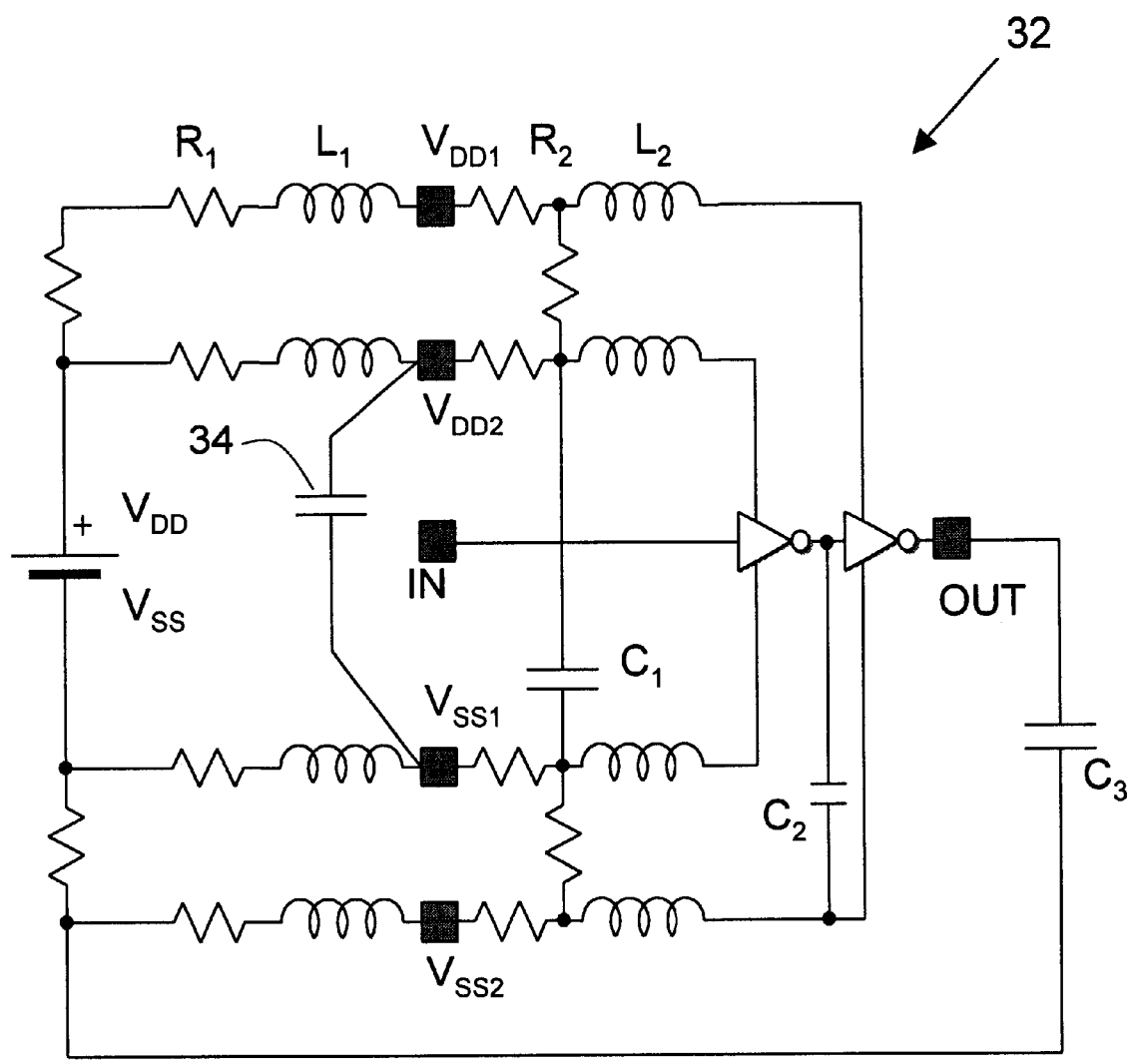

CIRCUIT AND METHOD FOR DETECTING TRANSIENT VOLTAGES ON A DC POWER SUPPLY RAIL

The present invention relates to testing of integrated circuits and, more specifically, to a method for testing the impedance of the power supply wiring of circuit boards and integrated circuits and to a circuit for use therewith.

BACKGROUND OF THE INVENTION

The number of pins for new integrated circuits (ICs) has been increasing for many years, and is likely to continue increasing. Most ICs have fewer than 100 pins, but many have more than 1000. For these larger ICs, between one third and two thirds of the pins can be power supply pins. The large proportion of power supply pins is needed to minimize the inductance and resistance between the off-chip power supply voltage and the on-chip circuitry. When logic gates switch, especially CMOS logic gates, their logic outputs can change state in less than a nanosecond and this can cause a transient voltage of similar duration on the power supply voltage rails due to the non-zero resistance and inductance in these rails. The transient voltage amplitude can exceed a third of the dc power supply voltage, but is typically less than 10% of this voltage. The transient voltage, if excessive, can increase or decrease the signal propagation delay through logic gates in the integrated circuit, which can cause logic errors. For this reason, IC designers ensure that sufficient power supply pins are used, while trying to avoid using too many pins (due to cost and area).

When an IC is soldered to a circuit board, it is possible that one or more of the many power supply pins is not soldered. This type of manufacturing defect is very difficult to detect electrically because the same board wire is connected in parallel to many of the IC's power pins, and the pins are also connected together within the chip. If the typically milliohm resistance and nanohenry inductance between an unconnected power pin and the board wire is measured, it will be almost indistinguishable from the resistance and inductance for a correctly connected pin. In any case, it is not practical in a production test environment to probe the hundreds of power pins of a high pin-count IC.

In a paper entitled, "*Opens Board Test Coverage: When is 99% Really 40%?*", published in the 1996 International Test Conference Proceedings, the problem of unconnected power supply pins is described in detail, and solutions proposed include X-ray laminography and optical inspection to detect missing solder on pins. The equipment costs hundreds of thousands of U.S. dollars, requires very specialized programming, a long test time relative to other tests ("between 30 and 40 joints/second"), and does not detect any on-chip connection defects.

In a paper entitled, "*Power Pin Testing: Making the Test Coverage Complete*", published in the 2000 International Test Conference Proceedings, a sensitive on-chip analog comparator is used to monitor the dc voltage drop across a segment of the on-chip power supply wiring near each power supply pin. This requires a low impedance load circuit to be activated in the IC to cause excess current to flow, the technique can detect excessive resistance only, and the IC area of the circuitry is relatively large (comparable to the area of a bond pad): 0.6% of the IC area for a 256 pin IC having 40 power pins, according to the referenced paper. The circuit requires several chip-wide signals to control the comparators, and the comparators require about 5 microseconds to perform a measurement (and hence cannot respond to nanosecond transient voltages).

In prior art for detecting voltage deviations on power supply rails, the intent is to detect when the power supply voltage decreases below some threshold voltage, below which, correct function of a main circuit is uncertain. FIG. 1A shows a schematic of a circuit 10 for detecting supply voltage deviations. The output 12 of the comparator 14 is typically connected to the reset of the main circuit, or to the reset of a flip-flop which is connected to the power-down input of the main circuit. The comparator compares the power rail voltage $V_{DD}$ divided by some number, such as two for example, as generated using a resistive divider formed by resistors 16 and 18, to a constant voltage derived across a zener diode 19. Circuit 10 is typically used to detect both rapid power loss ("blackout") and a slow decrease ("brownout") of the power supply voltage. Faster decreases ("transients") are also detectable; however, comparators cannot typically respond to transients faster than 10 nanoseconds, and this is usually intentional so that noise "glitches" on the power rail do not cause inadvertent reset of the main circuit powered by the power rail.

There is a need for a low cost test method for detecting the increase in impedance (resistance or inductance) caused by a missing power supply pin connection or any other defect, including poor design, that results in excessive transient voltages typically lasting less than 10 nanoseconds on power supply rails; these transients can cause incorrect logic signal propagation delays or incorrect logic operation.

SUMMARY OF THE INVENTION

The present invention provides a low cost test method and test circuit for detecting a missing power supply pin connection or any other defect that results in excessive transient voltages on power supply rails of a circuit.

The circuit includes a sensor logic gate whose input is connected to a dc voltage that is made independent of transient signals on the power supply rails of the sensor logic gate. An output of the sensor logic gate is connected to an input of a memory element, such as a latch or flip-flop. A stimulus logic gate, which causes a transient voltage and current on the power supply rails when it changes state, is connected to the same power supply rails as the sensor logic gate. A signal transition is applied to the input of the stimulus logic state and the state of the memory element is inspected. If the memory element changed state, there is a power supply defect associated with the power supply rails.

A preferred embodiment of the invention described herein uses a single, embedded digital latch or flip-flop per power rail point to be tested, and uses a single steady-state voltage, conveyed on chip-wide signal to control the sensitivity. Transient voltages having a duration less than 1 nanosecond can be sensed, and the amplitude threshold can range from tens of millivolts to volts.

One aspect of the present invention is generally defined as a method for detecting a missing or defective power supply pin connection or other defect that results in excessive transient voltages on power supply rails of a circuit having, for each of one or more power rails, a stimulus logic gate connected to the power rails, a sensor logic gate connected to the power rails and a memory element for storing the output of the sensor logic gate, the method comprising initializing the sensor logic gate to a dc voltage whose level is substantially independent of transient voltages on the power rails and initializing the memory element to a predetermined value; applying a signal transition to the stimulus logic gate connected to the supply voltage rail to cause a transient voltage in the power rails; and inspecting the output of the memory element for a change in state indicating that an excessive voltage transient was detected on the power rail.

Another aspect of the present invention is generally defined as a circuit for testing the quality of dc power supply voltage rails, the circuit comprising: a stimulus logic gate whose power supply is the supply voltage rails and whose changes of state causes a transient current in the supply voltage rails; a sensor circuit whose power supply is the supply voltage rails, and whose input is connected to a dc voltage reference whose voltage is substantially independent of transient voltages on the supply voltage rails; a latching circuit having an input for the output of the sensor logic gate; wherein a stimulus signal transition applied to the stimulus logic gate causes a change of state of the stimulus logic gate and the output of the latching circuit changes state if the amplitude of the transient voltage on the supply voltage rails exceeds a threshold.

BRIEF DESCRIPTION OF THE DRAWINGS

These and other features of the invention will become more apparent from the following description in which reference is made to the appended drawings in which:

FIG. 3 is a circuit diagram illustrating various circuit resistances and inductances that contribute to power rail transient voltages;

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

As is known in the art, integrated circuit devices are typically designed and fabricated using one or more computer data files, referred to herein as hardware definition programs, that define the layout of the circuit arrangements on the devices. The programs are typically generated by a design tool and are subsequently used during manufacturing to create the layout masks that define the circuit arrangements applied to a semiconductor wafer. Typically, the programs are provided in a predefined format using a hardware definition language (HDL) such as VHDL, verilog, EDIF, etc. While the invention has and hereinafter will be described in the context of fully functioning integrated circuit devices and data processing systems utilizing such devices, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy disks, hard disk drives, CD-ROM's, and DVD's, among others and transmission type media such as digital and analog communications links.

Figure 2A:
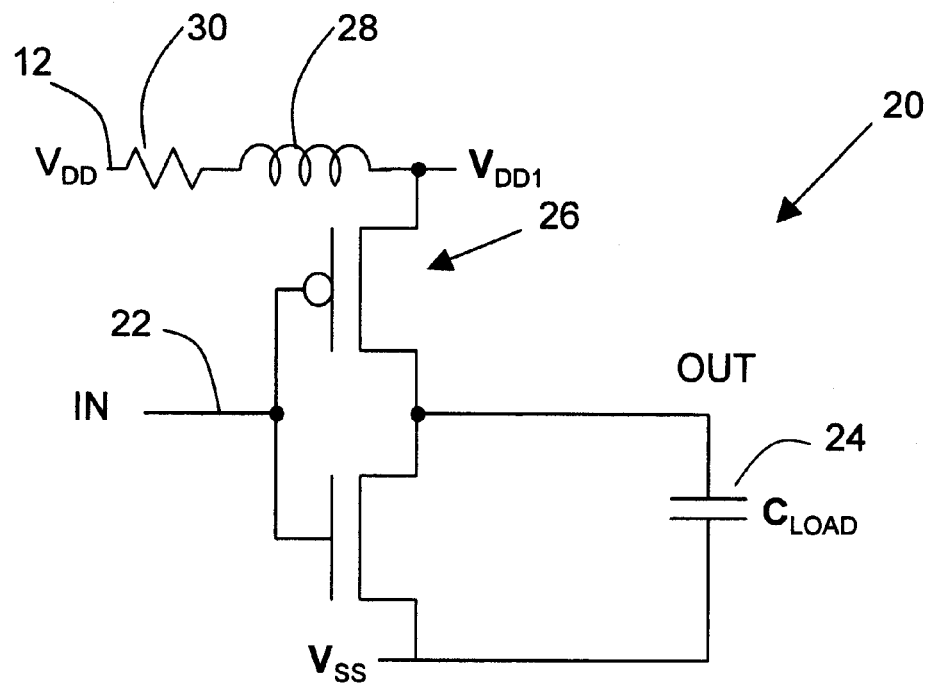
FIG. 2A is a circuit diagram illustrating a prior art CMOS logic inverter connected to power supplies rails $V_{DD}$ and $V_{SS}$.
Figure 2B:
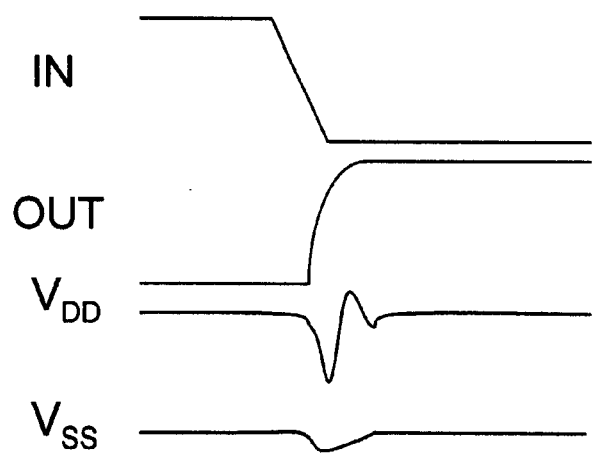
FIG. 2B shows the waveforms of the circuit in FIG. 2A.

When the output of a complementary metal oxide semiconductor (CMOS) logic inverter 20, as shown in FIG. 2A, switches from a logic 0 to logic 1 in response to a change in logic level at its input 22, as shown in FIG. 2B, current flows from the $V_{DD}$ power supply rail 12 to the output load capacitance 24 through the transistor 26 until the voltage across the capacitance equals that of $V_{DD}$. The duration of this current flow depends on the on-resistance of P-channel transistor 26, the capacitance value, and the voltage of $V_{DD}$ relative to $V_{SS}$. For present state-of the-art transistors, implemented in a 0.18 micron CMOS process, the duration is typically between 0.1 and 10 nanoseconds. The power rail typically has an inductance between 5 and 15 nanohenries and a resistance between 0.1 and 10 ohms. The transient current flow can induce a voltage drop of between 10 and 1000 millivolts, similar to that shown in FIG. 2B, across the inductance 28 and resistance 30.

The schematic of FIG. 2A is somewhat simplified. In reality, both power rails ($V_{DD}$ and $V_{SS}$) of a logic gate can have resistance, inductance, and capacitance, and the load capacitance may be connected to another power rail, as shown in a more realistic representation of the circuit such as circuit 32 in FIG. 3. The power supply itself may be many inches from the circuit, and there may be many decoupling capacitors 34 (only one is shown for simplicity) connected between the supply rails to help stabilize the voltages.

Figure 4A:
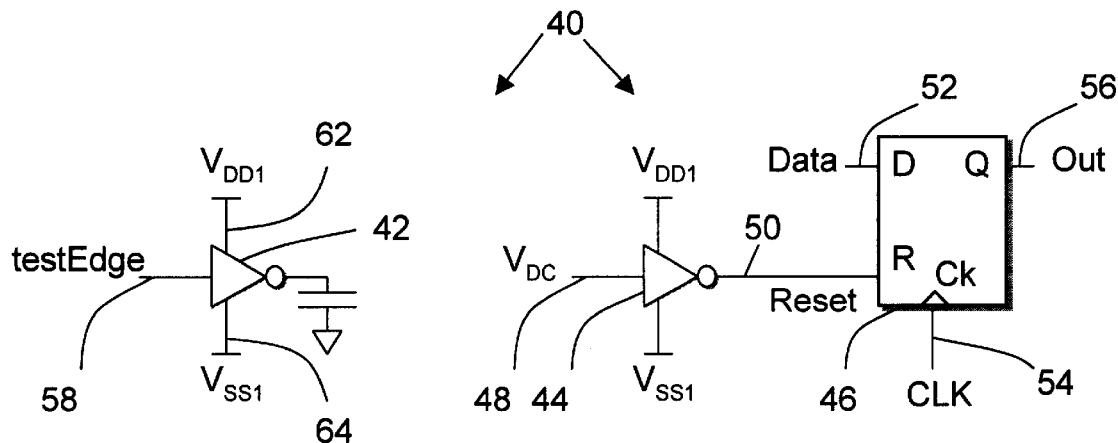
FIG. 4A is a circuit diagram of a circuit, according to one embodiment of the present invention, illustrating a first logic inverter used as a stimulus and a second logic inverter used as a sensor and whose input is connected to a dc voltage and whose output is connected to a flip-flop.

FIG. 4A illustrates a power supply rail test circuit 40 constructed according to the present invention. Circuit 40 includes a stimulus logic gate 42, a sensor logic gate 44, and a flip-flop 46 which is associated with a power supply rail to be monitored. The stimulus logic gate causes, when it changes state, a transient voltage on the supply voltage rail to which it is connected and has an input for receiving a stimulus signal transition for causing a change of state of the stimulus logic gate, therefore, a transient voltage on the supply voltage rail. The sensor logic gate responds to transient voltages which exceed a predetermined value by changing its state. The sensor logic gate is biased by a dc voltage reference whose voltage is substantially independent of transient voltages on said supply voltage rails and an output. The flip-flop is a memory element for storing a change of state of the sensor logic gate. The circuit is initialized to a predetermined value before testing. A stimulus signal is applied to the input of the circuit and then the content of the flip-flop is inspected. A change in the value of the content of the flip-flop indicates a problem with the voltage supply rail.

Figure 4B:
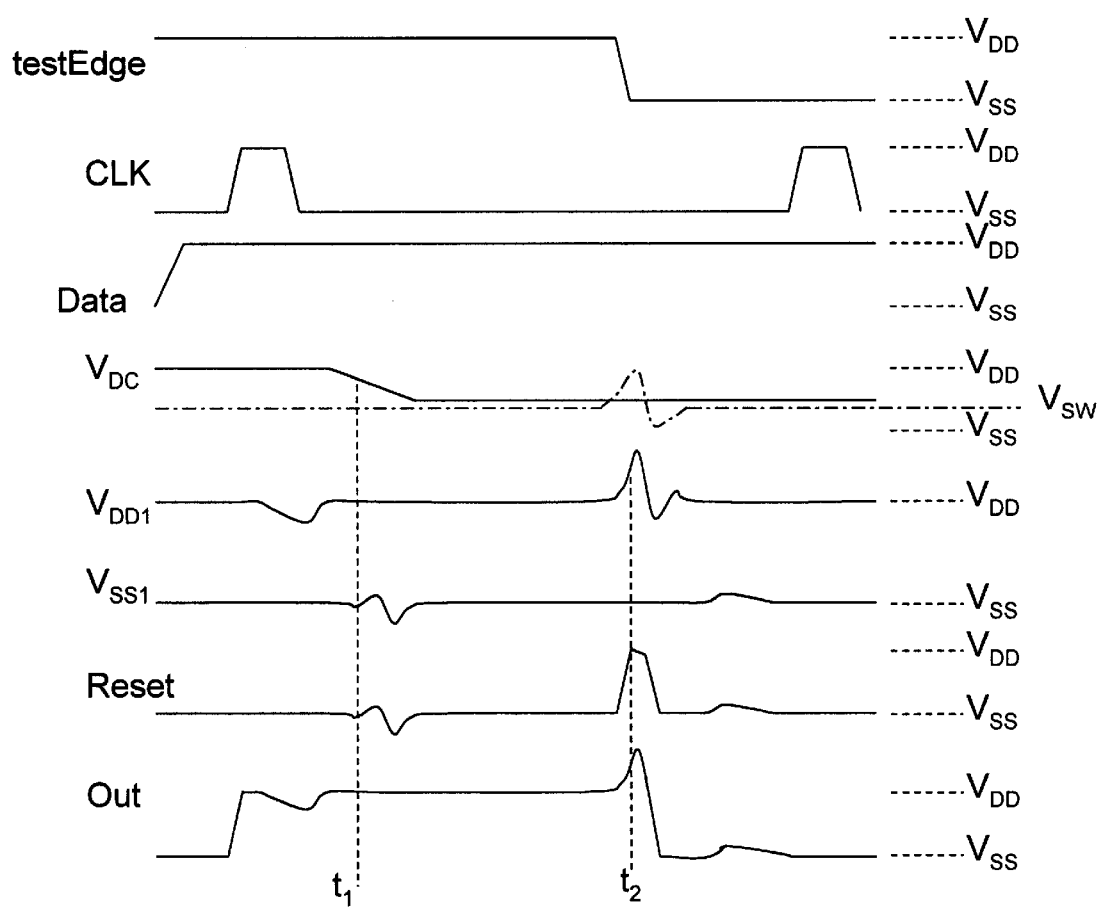
FIG. 4B shows the waveforms of the circuit in FIG. 4A.

The circuit of FIG. 4A is first initialized as follows. A dc voltage $V_{DC}$ is applied to the input 48 of the sensor logic gate. As shown in FIG. 4B, the $V_{DC}$ voltage is initially equal to $V_{DD}$. The output 50 of the sensor logic gate is connected to the asynchronous reset input of the flip-flop. The flip-flop is initialized by loading it with a logic 1: its data input 52 is logic 1, and its clock input 54 is pulsed, causing the output 56 to become logic 1. Next, the dc voltage is reduced at time $t_1$ to a predetermined voltage that is slightly greater than the input switching point voltage $V_{SW}$ of the sensor logic gate, so that the dc voltage still appears to be a logic 1 input to the sensor gate. The procedure for predetermining the dc voltage is described later.

At any time following the initialization sequence, an input transition signal, TestEdge, is applied to input 58 of stimulus logic gate 42 that is closely connected to the same power supply rails (62 and 64) as sensor logic gate 44. If the switching action of the stimulus logic gate causes a sufficiently large transient increase in either power rail voltage ($V_{DD1}$ or $V_{SS1}$), the sensor logic gate's input switching point voltage will increase above the dc voltage so that the dc voltage appears to become a logic 0 input to the sensor gate, and the sensor logic gate's output logic value will change state, and the flip-flop output signal will change to a logic 0. Thereafter, the output logic value of the flip-flop can be monitored directly, or shifted in the shift register of a scan path test access circuit, for example, according to the IEEE 1149.1 Standard.

To detect a transient decrease in either power rail voltage, a non-inverting logic gate is used instead of the inverter 44 in circuit 40, and during initialization, $V_{DC}$ is initially equal to the $V_{SS}$ voltage and is then increased to a predetermined voltage that is slightly less than the input switching point voltage $V_{SW}$ of the sensor logic gate, so that the dc voltage still appears to be a logic 0 input to the sensor gate. The transient is stimulated by the stimulus logic gate as previously described, and the flip-flop changes state if the transient voltage decreases sufficiently.

To make the sensor more sensitive to $V_{DD}$ transient voltages, relative to transient $V_{SS}$ voltages, a sensor logic gate is selected that has an input switching point voltage that is closer to $V_{DD}$ than to $V_{SS}$. Typically, a 4-input NAND gate has an above-mid-rail switching point voltage because it has four N-channel transistors in series between the output and $V_{SS}$, whereas it has four P-channel transistors in parallel between the output and $V_{DD}$. Correspondingly, a 4-input NOR gate typically has a below-mid-rail switching point voltage and can be used as a sensor logic gate that is more sensitive to transient voltages on $V_{SS}$.

Initialization can be simplified by using a circuit like that in FIG. 5, FIG. 6, FIG. 7A or FIG. 8A. The use of these circuits avoids the need for $V_{DC}$ to change from one voltage to another, allows faster initialization, and ensures that no power is consumed by the sensor logic gate when it is not being used to monitor transient voltages. $V_{DC}$ may be common to many sensor logic gates, and benefits from any capacitance because capacitance reduces noise on the $V_{DC}$ voltage.

Figure 5:
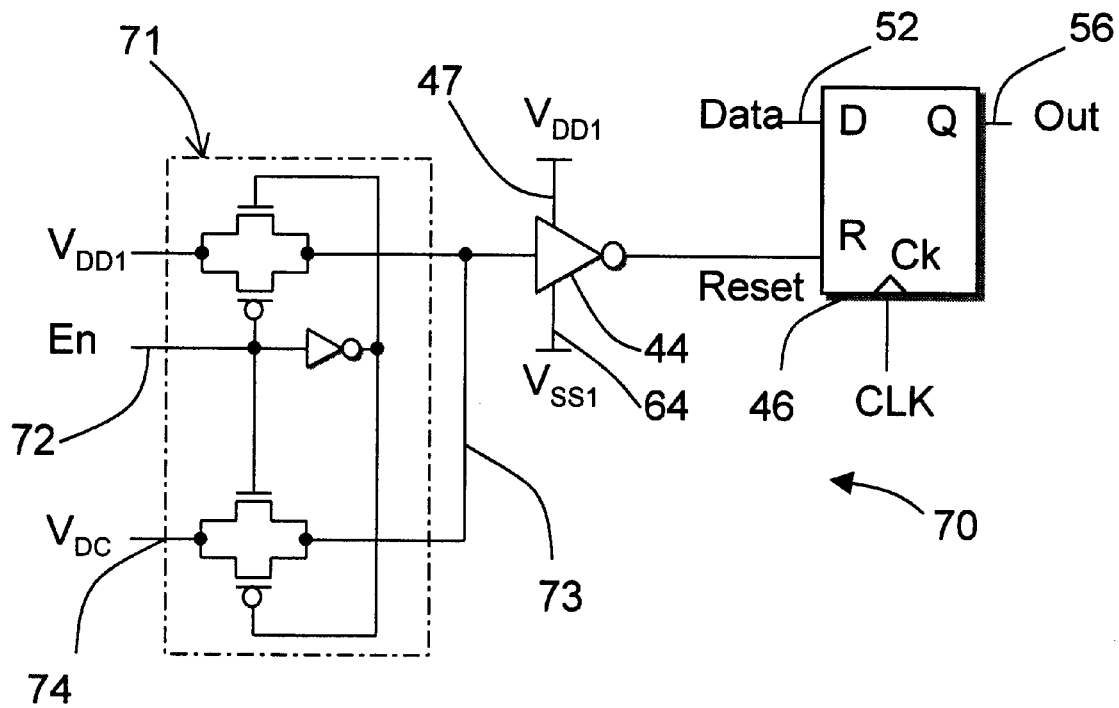
FIG. 5 is a circuit diagram of a circuit, according to an embodiment of the present invention, illustrating a CMOS Inverter used as a sensor whose input is connected to a dc voltage via a transmission gate and whose output is connected to a flip-flop.

The circuit 70 in FIG. 5 uses a conventional CMOS transmission gate multiplexer 71 to select between a logic 1 (for example, $V_{DD1}$) and $V_{DC}$. When the enabling signal 72 is a logic 0, the sensor logic gate's input is connected to $V_{DD1}$, and no power is consumed by the sensor logic gate. When the enabling signal is logic 1, the sensor logic gate's input 73 is connected to $V_{DC}$ 74, and the circuit responds to transient increases in either power rail voltage. As before, if a non-inverting gate is used, the circuit will be responsive to transient decreases in either power rail voltage. The stimulus logic gate 42 is still needed, but is not shown in FIG. 5 for simplicity.

Figure 6:
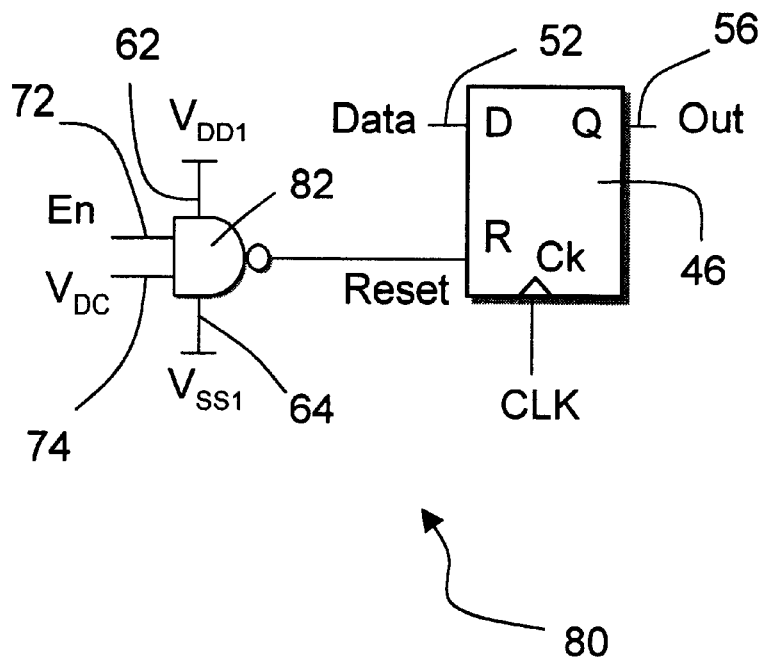
FIG. 6 is a circuit diagram of a circuit, according to an embodiment of the present invention, illustrating a CMOS NAND gate used as a sensor whose first input is connected to a dc voltage, whose second input is connected to an Enabling signal, and whose output is connected to a flip-flop.

Circuit 80 of FIG. 6 uses a 2-input NAND gate 82 instead of an inverter. This circuit decreases the resistance between the $V_{DC}$ wire and sensor logic gate's input, and is hence less sensitive to Miller capacitance (the inherent capacitance between a transistor's input and output) feedback within the sensor logic gate. Operation is similar to that of the circuit in FIG. 5. When the enabling signal 72 is logic 0, no current flows in NAND gate 82, and it is not responsive to transient voltages on the power rails. When the enabling signal is logic 1, the NAND gate acts as an equivalent to the inverter of FIG. 4 and responds to transient increases in either power rail voltage. As before, if a non-inverting gate is used, in this case, an AND gate, the circuit will be responsive to transient decreases in either power rail voltage. Again, stimulus logic gate 42 is still needed, but is not shown in FIG. 6 for simplicity.

Figure 7A:
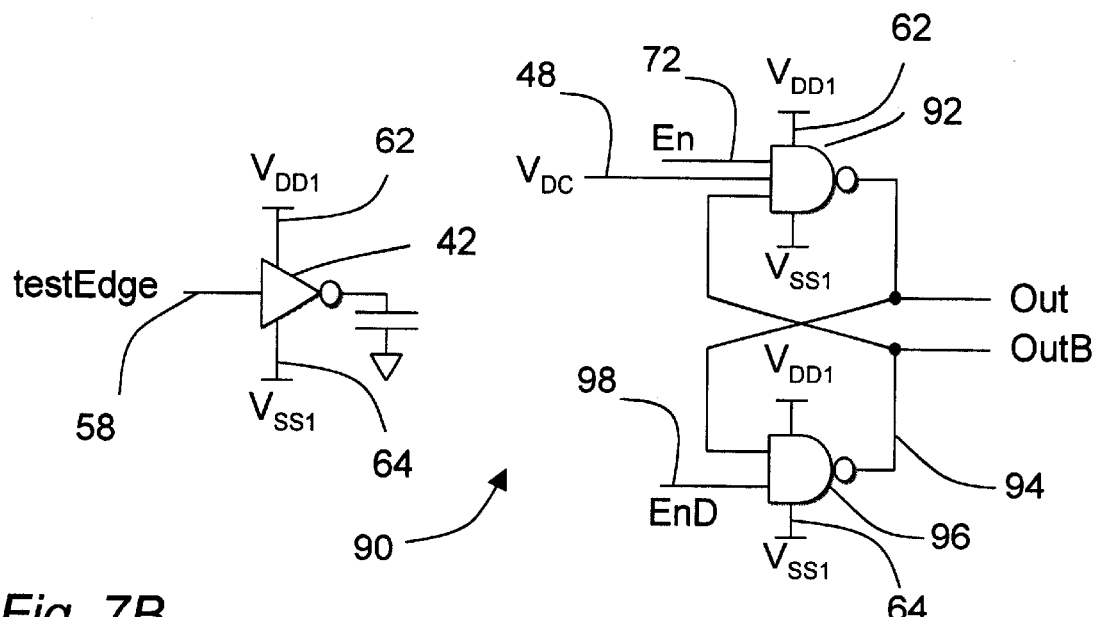
FIG. 7A is a circuit diagram of a circuit, according to an embodiment of the present invention, illustrating a CMOS NAND gate used as a sensor with a first input connected to a dc voltage, a second input connected to an Enabling signal, and a third input connected to a second NAND gate to form a set-reset flip-flop.

Circuit 90 of FIG. 7A is a preferred embodiment of the invention. The sensor logic gate in this circuit is an integral part of a set-reset flip-flop. The sensor logic gate is a NAND gate 92 that has a $V_{DC}$ input 48, an enabling input 72, and a feedback input 94. The feedback signal is the output of a second NAND gate 96 whose inputs are the output of first NAND gate 92 of the sensor logic gate and a delayed version 98 of the enabling signal. When the enabling signal 72 and its delayed version 98 are both logic 0, the sensor is disabled, no current flows in the NAND gates 92 and 96, and the circuit is not responsive to transient voltages on the power rails. $V_{DC}$ may be a continuous dc voltage or may be altered at any time before the enabling signals change to logic 1, at which time $V_{DC}$ must be greater than the switching point voltage of the sensor logic gate.

Figure 7B:
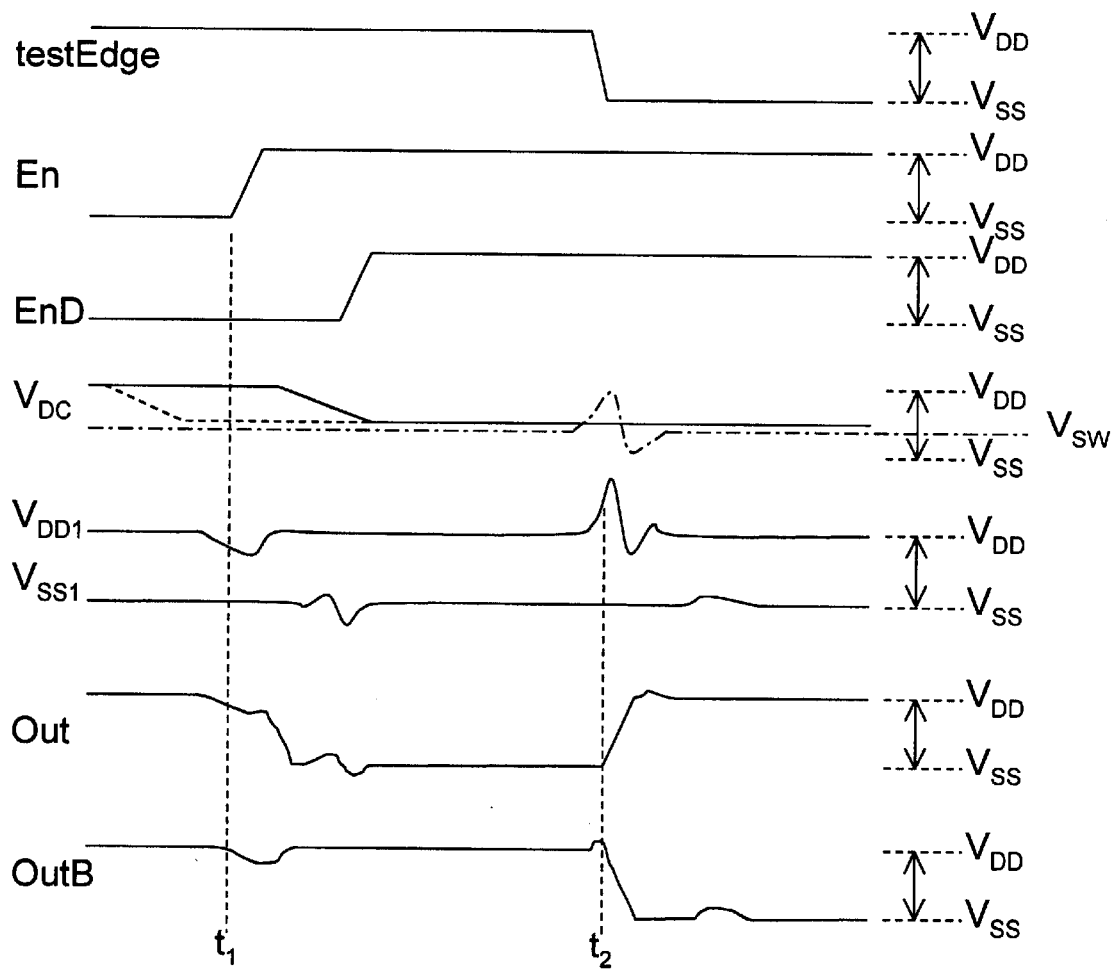
FIG. 7B shows the waveforms of the circuit in FIG. 7A.

During initialization of the circuit in FIG. 7A, as shown in the waveforms of FIG. 7B, the enabling signal 72 changes to a logic 1 at time $t_1$ and shortly afterwards, the delayed version 98 of the enabling signal changes to logic 1. The output of the sensor logic gate 92 will then be logic 0, and the output of the second NAND gate 96 will be logic 1. The delay between the two enabling signals may be implemented with an even number of inverters in series or with a D-type flip-flop that is clocked by some clock signal—the exact delay does not matter, but current may flow through the sensor logic gate during the delay interval and so the interval should be minimized but not made equal to zero. If the delay is zero, the flip-flop will not initialize deterministically, as is well known to most logic designers.

When both enabling signals are thus initialized to logic 1, and $V_{DC}$ is slightly greater than the input switching point voltage $V_{SW}$, the circuit responds to transient increases in either power rail voltage as follows: a transient increase in either power supply voltage at time $t_2$ causes the input switching point voltage of the sensor logic gate to increase and $V_{DC}$ to be interpreted as a logic 0; the output of the sensor logic gate changes from logic 0 to logic 1 in response to the transient; the output of second NAND gate 96 changes to a logic 0 because both of its inputs are now logic 1; thereafter further changes in the sensor logic gate's input switching point voltage or $V_{DC}$ have no effect on the state of the flip-flop, until the flip-flop is disabled and re-enabled.

Figure 8A:
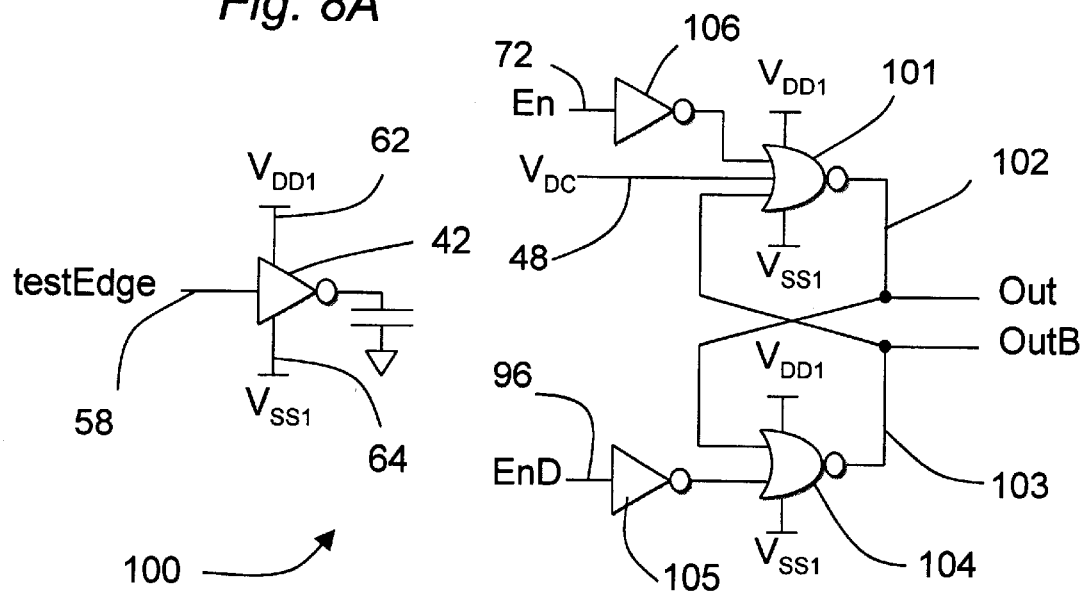
FIG. 8A is a circuit diagram of a circuit, according to an embodiment of the present invention, illustrating a CMOS NOR gate used as a sensor with a first input connected to a dc voltage, a second input connected to an Enabling signal, and a third input connected to a second NOR gate to form a set-reset flip-flop.

The circuit 100 of FIG. 8A is another preferred embodiment of the invention. It is a complimentary version to the circuit of FIG. 7A, because NOR gates are used instead of NAND gates, which allows the circuit to be responsive to transient decreases (instead of increases) in either power rail voltage. The operation is similar. The sensor logic gate is a NOR gate 101 that has a $V_{DC}$ input, an enabling input (inverted relative to the enabling signal 72 used in FIG. 7A), and a feedback input 103. The feedback signal is the output of a second NOR gate 104 whose inputs are the output 102 of sensor logic gate 101 and delayed version 96 of the enabling signal, inverted. When the enabling signal and its delayed version are logic 0 (causing the inverted enable inputs to the NOR gates to be logic 1), the sensor is disabled, no current flows in the NOR gate 101, and the circuit is not responsive to transient voltages on the power rails 62 and 64. $V_{DC}$ may be a continuous dc voltage or may be altered at any time before the enabling signals change to logic 1 at time $t_1$, at which time $V_{DC}$ must be less than the switching point voltage $V_{SW}$ of the sensor logic gate.

Figure 8B:
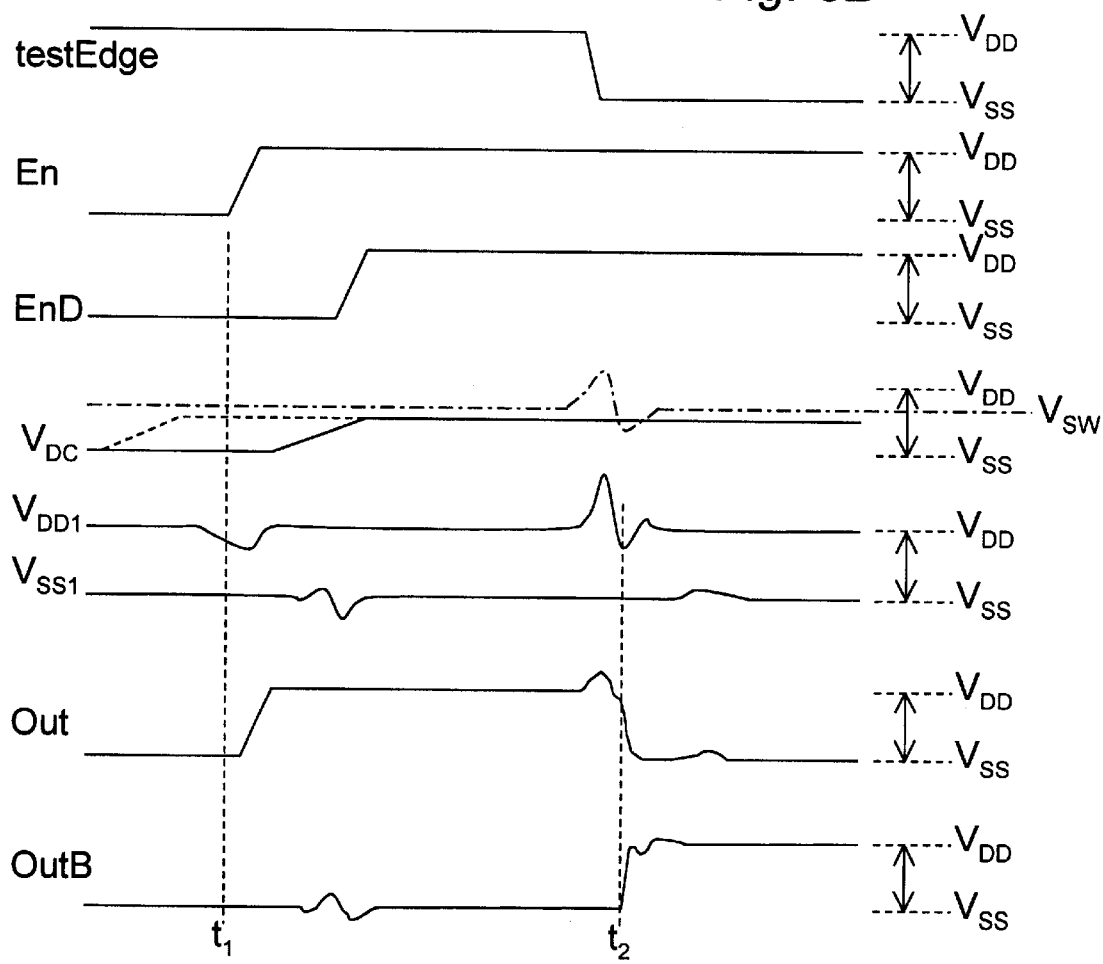
FIG. 8B shows the waveforms of the circuit in FIG. 8A.

During initialization of the circuit in FIG. 8A, as shown in the waveforms of FIG. 8B, the enabling signal changes to a logic 1 at time $t_1$ and shortly afterwards, the delayed version of the enabling signal changes to logic 1. The output of the sensor logic gate will then be logic 1, and the output of the second NOR gate will be logic 0.

When both enabling signals are thus initialized to logic 1, and $V_{DC}$ is slightly less than the input switching point voltage $V_{SW}$, the circuit responds to transient decreases in either power rail voltage as follows: a transient decrease in either power supply voltage causes the input switching point voltage of the sensor logic gate to decrease and $V_{DC}$ to be interpreted as a logic 1 by the sensor logic gate at time $t_2$; the output of the sensor logic gate changes from logic 1 to logic 0 in response to the transient; the output of the second NOR gate changes to a logic 1 because both of its inputs are now logic 0; thereafter further changes in the sensor logic gate's input switching point voltage or $V_{DC}$ have no effect on the state of the flip-flop, until the flip-flop is disabled and re-enabled.

Choosing a Value for $V_{DC}$

It is desirable to minimize the sensitivity of sensor circuit to unrelated noise, and to be able to adjust the sensitivity of the sensor logic gate to a specific transient voltage amplitude.

$V_{DC}$ should be generated relative to a $V_{SS}$ or $V_{DD}$ that is relatively independent of the $V_{SS1}$ and $V_{DD1}$ power supply circuit nodes: if $V_{DC}$ is generated using exactly the same power rails as the sensor, without any intervening resistance or inductance, then $V_{DC}$ would move in tandem with any transients on those power rails, and the sensor logic gate would not detect transients. $V_{DC}$ can be made relatively independent of $V_{DD1}$ and $V_{SS1}$ by generating $V_{DC}$ outside the circuit board or IC being tested. For ICs, it may not be necessary to use an extra pin for this voltage: the voltage can be conveyed to the sensor logic gate via a standard analog test bus that is used for other purposes, for example, a bus constructed according to the IEEE 1149.4 standard (entitled, "Standard for a Mixed Signal Test Bus"). $V_{DC}$ could also be generated within the board or IC being tested, adjacent to two entrant power supply pins—open circuits in those power supply pins and in power supply pins closer to the circuit under test will be detected.

Distributing $V_{DC}$ to a plurality of sensor logic gates will increase the intrinsic capacitance of the $V_{DC}$ wire. The wire might cross over various portions of, and hence be capacitively coupled to, the $V_{SS}$ and $V_{DD}$ distribution network. Fortunately, extra capacitance on the $V_{DC}$ wire helps to filter out noise, and the coupling to many signals can cause their averaged effect to be minimal.

To adjust the sensitivity of a sensor logic gate, $V_{DC}$ is set to a predetermined value. The predetermined value can be predetermined by first determining the sensor logic gate's input switching point voltage, $V_{SW}$, and setting $V_{DC}$ to a voltage that is greater than $V_{SW}$ by a calculated amount.

The switching point voltage can be determined by the following steps, which implements a binary search and uses the circuit of FIG. 4A, FIG. 5, FIG. 6, or FIG. 7A:

$V_{DC}$ is initially equal to $V_{DD}$, and a change voltage, $V_{delta}$, is initially equal to $(V_{DD}-V_{SS})/2$;

1. The circuit is initialized;
2. The $V_{DC}$ voltage is changed to equal $V_{DC}-V_{delta}$;
3. $V_{delta}=V_{delta}/2$, for the next step;
4. If the output logic value changes state,
   then the circuit is re-initialized and then $V_{DC}=V_{DC}+V_{delta}$,
   else the circuit is re-initialized and then $V_{DC}=V_{DC}-V_{delta}$;
5. Steps 3 and 4 are repeated, in sequence, until $V_{delta}$ becomes sufficiently small at which time $V_{DC}$ will be approximately equal to $V_{SW}$.

For example, if $V_{DD}=4$ volts, $V_{SS}=0$, $V_{SW}=2.3$ volts, the binary search would proceed as follows:

1. $V_{DC}=4$ volts ($V_{delta}=2$);
2. $V_{DC}$ is reduced to $4-2=2$ volts;
3. The output of the sensor will change state, so the circuit is re-initialized and then $V_{DC}=2+1=3$ volts
4. The output of the sensor will not change state, so the circuit is re-initialized and then $V_{DC}=3-0.5=2.5$ volts
5. The output of the sensor will not change state, so the circuit is re-initialized and then $V_{DC}=2.5-0.25=2.25$ volts
6. The output of the sensor will change state, so the circuit is re-initialized and then $V_{DC}=2.25+0.125=2.375$ volts
7. The output of the sensor will not change state, so the circuit is re-initialized and then $V_{DC}=2.375-0.0625=2.3125$ volts
8. The output of the sensor will not change state, so the circuit is re-initialized and then $V_{DC}=2.3125-0.03125=2.28125$ volts At this point the binary search can stop, because $V_{delta}$ is less than 50 mV, and $V_{DC}$ is within 25 mV of $V_{SW}$.

To detect transient increases that have an amplitude greater than some threshold $V_{TH}$, $V_{DC}$ is chosen such that:

$V_{DC}=V_{SW}+V_{amplitude}\times(V_{SW}/(V_{DD}-V_{SS}))$.

This formula accounts for the greater influence of the power rail that is closer in value to $V_{SW}$. For example, to detect transient voltages greater than 0.2 V, assuming $V_{SW}$ is known to be 2.3:

$$V_{DC}=2.3+0.2\times(2.3/4)=2.3+0.115=2.415 \text{ volts}.$$

A Schmitt-trigger logic gate can be used as the sensor logic gate, in the circuits of FIGS. 4A, 5, 6, 7A and 8A. A single-input Schmitt-trigger logic gate has two switching point voltages. A higher switching point voltage is in effect while the input is a logic 0, and a lower switching point voltage is in effect while the input is a logic 1. This hysteresis reduces the sensitivity of the logic gate to noise while the input signal is in transition, especially for slow transitions. The binary search procedure described previously, herein, is suitable for inputs that have hysteresis because the input voltage is always returned to $V_{DD}$ as part of the initialization portion of each step.

Other Implementations

Figure 9A:
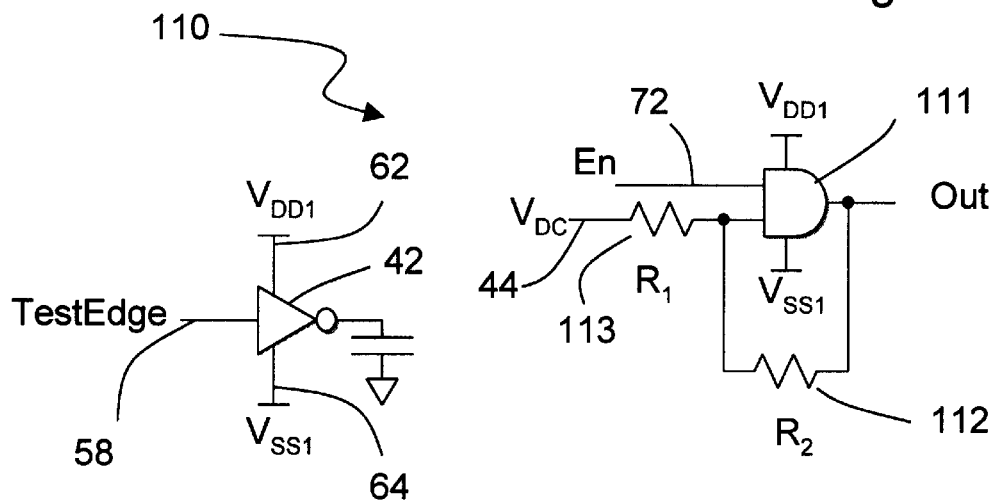
FIG. 9A is a circuit diagram of a circuit, according to an embodiment of the present invention, illustrating a Schmitt-trigger logic gate used as a sensor circuit.
Figure 9B:
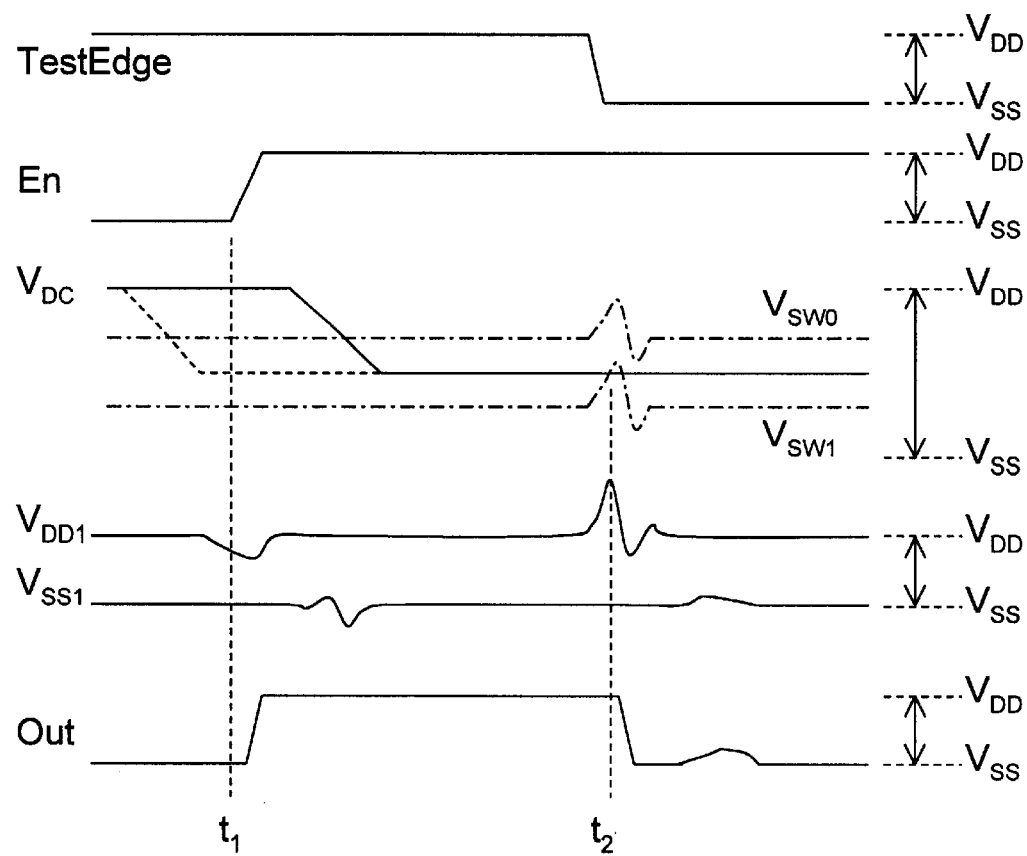
FIG. 9B shows the waveforms of the circuit in FIG. 9A.

Circuit 110 in FIG. 9A shows how a Schmitt-trigger logic gate can be used as both a sensor logic gate and a latch. In this case, a 2-input AND gate 111 is used so that an enabling signal 72 can disable the circuit to reduce power consumption when $V_{DC}$ is a mid-rail voltage and the circuit output is not being monitored. FIG. 9B shows waveforms during the operation of this circuit and shows the two switching point voltages $V_{SW0}$ and $V_{SW1}$, as horizontal dashed lines: $V_{SW0}$ is the switching point voltage when the input is a logic 0, and $V_{SW1}$ is the switching point voltage when the input is a logic 1. Both switching points will be affected by transient voltages on the power rails, as shown in the figure. The change in switching points, for this circuit, is caused by the positive feedback implemented by the resistors R1 113 connected to the input of the AND gate, and R2 112, connected between the input and output of the AND gate with R2 typically having a higher resistance than R1. This implementation of an input with hysteresis in its switching point voltage is well known to those skilled in the art.

The circuit in FIG. 9A can be initialized as previously described for other circuits herein; $V_{DC}$ begins at a voltage equal to $V_{DD}$ and then decreases to a voltage that is above the logic 1 switching point voltage $V_{SW1}$ but below the logic 0 switching point voltage $V_{SW0}$. The circuit is enabled at time $t_1$ and a power supply rail transient voltage occurs at time $t_2$ due to the stimulus logic gate. When the transient occurs, the input switching point also shifts and, if the transient amplitude is sufficient, the sensor logic gate will switch states, which changes the active switching point voltage to $V_{SW0}$. With $V_{DC}$ having a voltage between $V_{SW0}$ and $V_{SW1}$, as just described, the sensor logic gate 111 can itself implement the latching function. As previously described for other circuits herein, the output logic value can be monitored directly or via a serial shift register.

A stimulus logic signal can be applied to the stimulus logic gate 42 in any of the previously described embodiments of the invention, at predetermined times and with predetermined transitions (rising or falling). Alternatively, the sensor circuitry can be initialized and the stimulus logic signal can be pseudo-random events over an extended period of time.

The sensor logic gate 44 can be placed in selected areas of an IC. For example, if placed in the boundary region, near the input and output pin drivers, excess transients due to un-soldered power pins are more easily detected, especially if the stimulus logic gate is an output pin driver. If the sensor is placed in the central core of an IC, it can more easily detect transients due to flawed or insufficient power rail wiring in the core of the IC.

The sensor logic can be placed in a plurality of ICs on a circuit board. The ICs may contain many other mission-mode functions, or may be dedicated to providing test functions. Thus used, the sensor ICs can detect excess power rail transient voltages caused by un-soldered power rail capacitors or inductors, or by insufficient values for the capacitors or inductors.

The larger the capacitance connected to the output of a stimulus logic gate, the larger the amplitude of the power rail transient voltage. Therefore, logic gates that have larger capacitive loads than other logic gates can be exploited to better test power rail quality. Capacitances that are intentionally larger than required for a mission-mode function can be used to induce larger than normal transients, and hence provide verification of safety margin.

Analog amplifiers can convey and amplify the $V_{DC}$ voltage, and if their outputs are sufficiently responsive to transient voltages on the power rails (that is, they have a poor power supply rejection ratio), the amplifiers can be used as any of the "logic" gates previously described in the present invention.

Figure 1A:
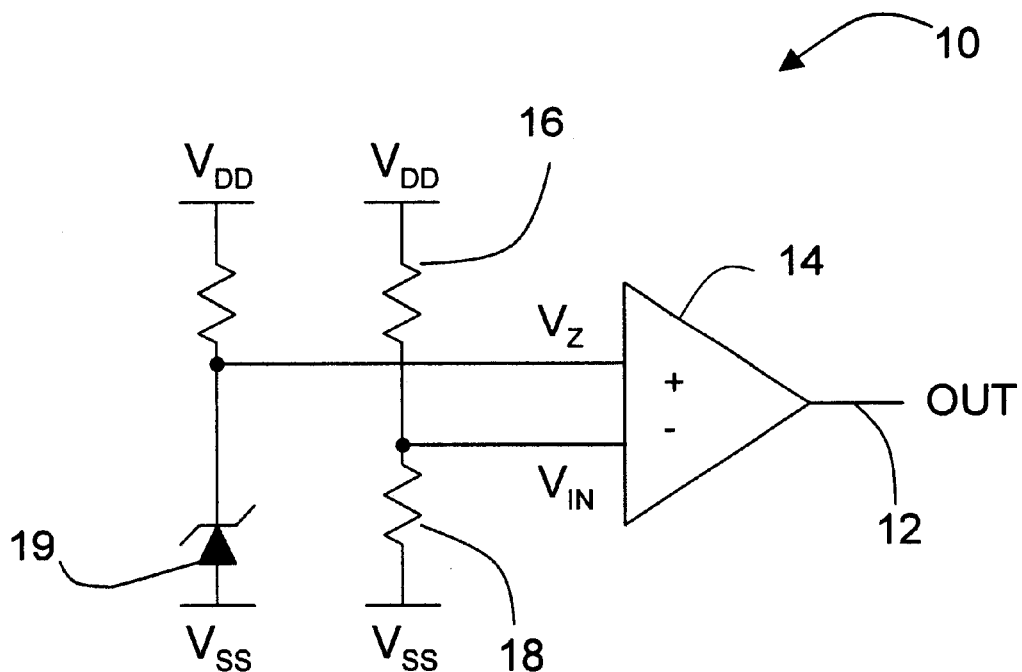
FIG. 1A is a circuit diagram illustrating a prior art comparator that compares the voltage of power supplies $V_{DD}$ to a constant reference voltage.
Figure 1B:
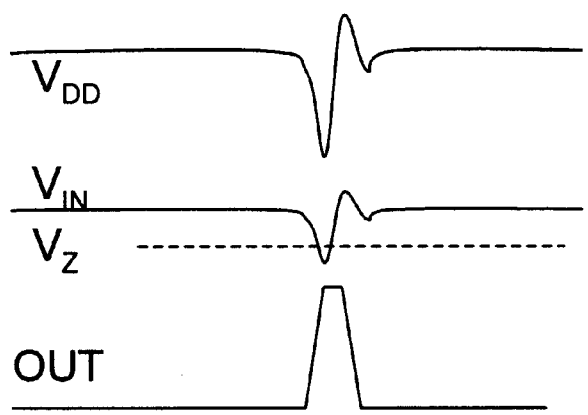
FIG. 1B shows the waveforms of the circuit in FIG. 1A.

Power supply voltage monitors, like the one shown in FIG. 1A, if they are fast enough, can be used to detect the transient caused by a switching stimulus logic gate, and thereby be used to test the impedance of the power supply rail.

Although the present invention has been described in detail with regard to preferred embodiments and drawings of the invention, it will be apparent to those skilled in the art that various adaptions, modifications and alterations may be accomplished with departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

I claim:

1. A circuit for testing the quality of dc power supply voltage rails, the circuit comprising:
   a stimulus logic gate having power supply inputs connected to said power supply voltage rails and which causes a transient voltage in said supply voltage rails when changing state;
   a sensor logic gate having power supply inputs connected to said power supply voltage rails and an input connected to a dc voltage reference having a voltage which is substantially independent of transient voltages on said power supply voltage rails;
   a latching circuit having an input for receiving the output of said sensor logic gate;
   said stimulus logic gate changing state in response to a stimulus signal transition, causing a transient voltage on said supply voltage rails and a change of state in the output of said latching circuit if the amplitude of said transient voltage on said supply voltage rails exceeds a predetermined voltage threshold.

2. A circuit as defined in claim 1, said sensor logic gate having a switching point voltage, and wherein transient voltages that traverse said voltage threshold causing said switching point voltage of said sensor logic gate to be traversed by said dc voltage, which, in turn, causes a change in the output state of said sensor logic gate and a change in the state of said latching circuit indicating that an excessive transient voltage occurred.

3. A circuit as defined in claim 1, said stimulus logic gate being proximate said sensor logic gate.

4. A circuit as defined in claim 1, further including a transmission gate for conveying said dc voltage to said sensor gate.

5. A circuit as defined in claim 1, wherein said dc voltage being a voltage that makes the output of said sensor logic gate change state only when the amplitude of said transient voltage exceeds a predetermined threshold.

6. A circuit as defined in claim 1, wherein said sensor logic gate is a CMOS logic gate.

7. A circuit as defined in claim 1, said sensor logic gate having an enabling input signal for selectively enabling and disabling said circuit.

8. A circuit as defined in claim 1, said sensor logic gate having two switching point voltages and said dc voltage having a value between the said two switching point voltages so that said sensor logic gate implements said latch circuit.

9. A circuit as defined in claim 1, wherein said latching circuit being a flip-flop.

10. A circuit as defined in claim 1, said latching circuit including a scannable memory element.

11. A circuit as defined in claim 1, said sensor logic gate being an integral part of a flip-flop.

12. A circuit as defined in claim 1, further including a serial shift register for conveying an input to said stimulus logic gate.

13. A circuit as defined in claim 1, further including a serial shift register for unloading data stored in said memory element for inspection.

14. A circuit as defined in claim 13, wherein said serial shift register is part of a data register as defined by the IEEE 1149.1 Test Bus Architecture standard.

15. A circuit as defined in claim 1, wherein the output of said stimulus logic gate is connected to a load that causes excessive transient voltages on said dc power supply voltage rails.

16. A circuit as defined in claim 1, said circuit being located on a single integrated circuit.

17. A circuit as defined in claim 1, said circuit being distributed among a plurality of integrated circuits.

18. A circuit as defined in claim 1, wherein any of said logic gates being an analog amplifier having sufficient input-to-output gain to convey logic signals and sufficiently low power supply rejection to convey said transient voltages to said latch circuit.

19. A circuit as defined in claim 1, wherein said dc voltage is conveyed using an analog bus as defined by the IEEE 1149.4 standard.

20. In a circuit having a plurality of power supply pins, the improvement comprising, for each supply voltage rail point to be tested:
    a stimulus logic gate whose changes of state cause a transient voltage or current on a supply voltage rail connected to a power supply input of said stimulus logic gate, said stimulus logic gate having an input for receiving a stimulus signal transition for causing a change of state of said stimulus logic gate; and
    a sensor logic gate having an output, and an input for receiving a dc voltage reference whose voltage is substantially independent of transient voltages on said supply voltage rails and whose magnitude is substantially equal to the switching point voltage of said sensor logic gate, said sensor and stimulus logic gates being proximate one another and said voltage supply rail point to be tested; and
    a memory element having an input connected to the output of said sensor logic gate for storing a change of state of said sensor logic gate.

21. A circuit as defined in claim 20, the magnitude of said dc voltage being slightly above or below the switching point voltage of the sensor logic gate.

22. A circuit as defined in claim 20, each said logic gate being an inverter and said memory element being a set-reset flip-flop and the output of said sensor logic gate being connected to the reset input of said flip-flop.

23. A circuit as defined in claim 20, further including means for minimizing power consumption by the sensor logic gate when it is not in use, said means being responsive to a first logic input for enabling said sensor logic gate and responsive to a second logic input for disabling said logic gate.

24. A circuit as defined in claim 20, further including a selector responsive to an enable signal for selectively applying said dc voltage or the voltage of said voltage supply rail to the input of said sensor logic gate.

25. A circuit as defined in claim 24, said selector being a CMOS transmission gate.

26. A circuit as defined in claim 24, said stimulus logic gate and said sensor logic gate being an inverter and said memory element being a set-reset flip-flop with said sensor logic gate output being connected the reset input of said flip-flop.

27. A circuit as defined in claim 20, said sensor logic gate being a NAND gate having a first input for receiving said dc voltage and a second input for receiving an enable signal.

28. A circuit as defined in claim 27, said stimulus logic gate being an inverter and said memory element being a set-reset flip-flop with said sensor logic gate output being connected the reset input of said flip-flop.

29. A circuit as defined in claim 20, said sensor logic gate being an integral part of a set-reset flip-flop comprising:
    a first NAND gate having a input for said dc voltage, an enabling input, and a feedback input and an output; and
    a second NAND gate having an input for receiving the output of said first NAND gate and an input for a delayed enabling signal and having an output, said feedback signal being said output of said second NAND gate;
    whereby when the enabling signal and said delayed enabling signal are both logic 0, said sensor is disabled, no current flows in said NAND gates and the circuit is not responsive to transient voltages on said power rails.

30. A circuit as defined in claim 20, said sensor logic gate being an integral part of a set-reset flip-flop wherein:
    said sensor logic gate being a NOR gate having a input for said dc voltage, an enabling input, and a feedback input and an output; and
    a second NOR gate having an input for the output of said first NOR gate and an input for a delayed version of said enabling signal and having an output, said feedback signal being said output of said second NOR gate;
    whereby when the enabling signal and said delayed version of said enabling signal are both logic 0, said sensor is disabled, no current flows in said NOR gates and the circuit is not responsive to transient voltages on said power rails.

31. A circuit as defined in claim 20, including a Schmitt-trigger logic gate serving as said sensor logic gate and said memory element providing first and second switching point voltages which are slightly greater and less than said dc voltage and including:
    an AND gate having a first input for said dc voltage and second input for an enabling signal; a first resistor connected to said first input and a second resistor connected between said first input and the output of said AND gate.

32. A method for testing the amplitude of transient voltages on a dc power supply voltage rail, wherein a mid-rail dc voltage is applied to the input of a logic gate whose output is connected to an input of a latching circuit, and whose power supply is said supply voltage rail, the method comprising the steps:

applying a dc voltage whose level is substantially independent of transient voltages on said supply voltage rail and which is a predetermined amount above or below an input switching point voltage of said logic gate;

initializing said latching circuit;

applying a signal transition to a second logic gate that is connected to said supply voltage rail; and monitoring the output of said latching circuit for a change in state thereof indicating that an excessive voltage transient voltage was detected on said supply voltage rail.

33. A method as defined in claim 32, further including prior to testing, further including predetermining said dc voltage comprising:

setting the dc voltage equal to the voltage of a power rail and a change voltage equal to one half of the difference of the voltage between a pair of power rails;

repeating the following in sequence, until said change voltage is reduced to a predetermined value and said dc voltage is approximately equal to the switching point voltage of the sensor logic gate:

initializing the circuit;

setting the dc voltage equal to the dc voltage less the change voltage;

dividing the change voltage in half; and determining whether the output logic value of said circuit changes state and, if so, re-initializing the circuit and setting the dc voltage equal to the sum of the dc voltage and the change voltage and, if not, re-initializing the circuit and setting the dc voltage equal to the dc voltage less the change voltage.

34. A method for testing the impedance of a dc power supply voltage rail in which a mid-rail dc voltage reference is applied to the input of a sensor circuit whose output is connected to an input of a latching circuit, the method comprising the steps:

applying to an input of said sensor circuit a dc voltage whose level is substantially independent of transient voltages on said supply voltage rail and initializing said latching circuit;

applying a signal transition to a logic gate that is connected to said supply voltage rail;

monitoring the output of said latching circuit; a change in state indicating that an excessive voltage transient voltage was detected on said supply voltage rail and that the impedance of said supply voltage rail is excessive.

35. A method for detecting a missing power supply pin connection or other defect that results in excessive transient voltages on power supply rails of a circuit having, for each of one or more power rails, a stimulus logic gate connected to said power rails, a sensor logic gate connected to said power rails and a memory element for storing the output of said sensor logic gate, the method comprising:

initializing said sensor logic gate to a dc voltage whose level is substantially independent of transient voltages on said power rails and initializing said memory element to a predetermined value applying a signal transition to one or more of each said stimulus logic gate that is connected to said supply voltage rail to cause a transient voltage in said power rails;

inspecting the output of said memory element for a change in state thereof indicating that an excessive voltage transient voltage was detected on said power rail.

36. A method as defined in claim 35, said inspecting the output including unloading the output logic level of said latching circuit to test equipment by using a serial shift register.

37. A method as defined in claim 35, wherein, to detect transient voltage increases that have an amplitude greater than a predetermined threshold, further including setting the magnitude of the dc voltage substantially equal to the sum of the switching point voltage of the sensor logic gate and the product of the desired amplitude and the switching point voltage divided by the difference in voltage of the two power rails connected to the sensor logic gate.

* * * * *